United States Patent
Choi et al.

(10) Patent No.: US 9,224,598 B2
(45) Date of Patent: Dec. 29, 2015

(54) METHOD OF FORMATION OF TIN OXIDE SEMICONDUCTOR THIN FILM DOPED WITH ANTIMONY

(71) Applicants: Samsung Display Co., Ltd., Yongin (KR); Industry-Academic Cooperation Foundation, Yonsei University, Seoul (KR)

(72) Inventors: Chaun-Gi Choi, Yongin (KR); Yeon-Gon Mo, Yongin (KR); Hyun-Jae Kim, Seoul (KR); Hyun-Soo Lim, Seoul (KR); Si-Joon Kim, Seoul (KR); Tae-Soo Jung, Seoul (KR); You-Seung Rim, Seoul (KR)

(73) Assignees: SAMSUNG DISPLAY CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 0 days.

(21) Appl. No.: 14/097,685

(22) Filed: Dec. 5, 2013

(65) Prior Publication Data
US 2015/0011044 A1     Jan. 8, 2015

(30) Foreign Application Priority Data
Jul. 8, 2013   (KR) .................. 10-2013-0079897

(51) Int. Cl.
H01L 21/00     (2006.01)
H01L 21/02     (2006.01)

(52) U.S. Cl.
CPC .... *H01L 21/02565* (2013.01); *H01L 21/02628* (2013.01)

(58) Field of Classification Search
CPC .................................... H01L 21/02565
USPC ...................... 438/104; 252/519.3
See application file for complete search history.

(56) References Cited

U.S. PATENT DOCUMENTS

| | | | | |
|---|---|---|---|---|
| 5,484,694 | A * | 1/1996 | Lelental et al. | 430/530 |
| 6,521,295 | B1 * | 2/2003 | Remington, Jr. | 427/255.19 |
| 7,145,174 | B2 | 12/2006 | Chiang et al. | |
| 7,189,992 | B2 | 3/2007 | Wager et al. | |
| 8,097,302 | B2 * | 1/2012 | Korotkov et al. | 427/255.34 |
| 2001/0031366 | A1 * | 10/2001 | Terneu et al. | 428/432 |
| 2011/0050091 | A1 * | 3/2011 | Fekety et al. | 313/504 |

FOREIGN PATENT DOCUMENTS

| | | |
|---|---|---|
| KR | 10-2010-0028347 | 3/2010 |
| KR | 10-2012-0055868 | 6/2012 |
| KR | 10-2012-0077566 | 7/2012 |
| KR | 10-2012-0077787 | 7/2012 |

* cited by examiner

*Primary Examiner* — Caleb Henry
(74) *Attorney, Agent, or Firm* — Cantor Colburn LLP (57) ABSTRACT

Provided is a composition for forming tin oxide semiconductor including a tin precursor compound, an antimony precursor compound, and a solvent, according to an aspect of the present disclosure. Also provided is a method of forming a tin oxide semiconductor thin film. The method includes preparing a composition including a tin precursor compound and an antimony precursor compound dissolved in a solvent; disposing the composition on a substrate; and performing a heat treatment on the substrate coated with the composition.

20 Claims, 3 Drawing Sheets

METHOD OF FORMATION OF TIN OXIDE SEMICONDUCTOR THIN FILM DOPED WITH ANTIMONY

RELATED APPLICATIONS

This application claims priority to Korean Patent Application No. 10-2013-0079897, filed on Jul. 8, 2013, and all the benefits accruing therefrom under 35 U.S.C. §119, the contents of which in their entirety are herein incorporated by reference.

BACKGROUND

1. Field

One or more embodiments of the present invention relates to an oxide semiconductor, and more particularly, to a composition for a tin oxide semiconductor and a method of manufacturing a tin oxide semiconductor thin film.

2. Description of the Related Art

An oxide semiconductor has many advantages. For example, it has a higher electron mobility than that of non-crystalline silicon, can be processed at lower temperatures than polycrystalline silicon, and is transparent to visible light. It is therefore useful as a semiconductor layer in an electronic device such as a thin film transistor.

Various materials including base materials of In, Zn, or the like, added with various metals such as Ga, Hf, Sn, or the like, have been used as an oxide semiconductor. Thin films of these oxide semiconductors have been mostly manufactured by vacuum processes such as pulsed laser deposition (PLD), sputtering, atomic layer deposition (ALD), or the like.

When an oxide semiconductor thin film, including a plurality of metals, is formed by a vacuum process, it may be difficult to secure uniformity in the resulting composition. In addition, when indium (In) is used, it may increase the manufacturing costs.

It is therefore desirable to find a new version of an oxide semiconductor to replace an indium-containing oxide semiconductor.

SUMMARY

According to an aspect of the present invention, there is provided a composition for forming a tin oxide semiconductor, including a tin precursor compound, an antimony precursor compound, and a solvent.

The tin precursor compound may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or a combination thereof.

The antimony precursor compound may include antimony(III) chloride, antimony(V) chloride, antimony(III) ethoxide, antimony(V) sulfide, antimony(V) fluoride, antimony(III) propoxide, antimony(III) iodide, antimony(III) acetate, or a combination thereof.

The solvent may include a polar solvent such as deionized water, methanol, ethanol, propanol, isopropanol, 2-methoxyethanol, 2-ethoxyethanol, 2-propoxyethanol, 2-butoxyethanol, methyl cellosolve, ethyl cellosolve, diethyleneglycolmethylether, ethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyl lactate, propyleneglycolmethyletheracetate, propyleneglycolmethylether, propyleneglycolpropylether, methyl cellosolve acetate, ethyl cellosolve acetate, diethyleneglycolmethylacetate, diethyleneglycolethylacetate, acetone, methylisobutylketone, cyclohexanone, dimethylformamide (DMF), N,N-dimethylacetamide(DMAc), N-methyl-2-pyrrolidone, γ-butyrolactone, diethylether, ethyleneglycoldimethylether, diglyme, tetrahydrofuran, acetylacetone, acetonitrile, or a combination thereof.

The molar ratio between the antimony precursor compound and the tin precursor compound may be in an amount of about 0.4 to about 0.9.

The respective molar concentration of the antimony precursor compound and the tin precursor compound relative to the total composition is about 0.1M to about 10M.

According to another aspect of the present invention, there is provided a method of forming a tin oxide semiconductor thin film including: preparing a composition comprising a tin precursor compound and an antimony precursor compound dissolved in a solvent; coating the composition on a substrate; and performing a heat treatment on the substrate coated with the composition.

The heat treatment may include a first heat treatment performed at a temperature of about 100° C. to about 300° C., and a second heat treatment performed at a temperature of about 300° C. to about 500° C.

The coating may be performed using a method which includes spin coating, dip coating, inkjet printing, screen printing, a spray process, roll-o-roll process, or a combination thereof.

The tin oxide semiconductor may include $SnO_x$ ($0<x\leq3$), wherein Sb is doped thereon.

The tin oxide semiconductor thin film may be non-crystalline.

The resistivity of the tin oxide semiconductor thin film may be in an amount of about $10^{-2}$ Ω·cm to about $10^1$ Ω·cm.

The concentration of a charge carrier of the tin oxide semiconductor thin film may be in an amount of about $10^{14}$ cm$^{-3}$ to about $10^{16}$ cm$^{-3}$.

The charge carrier may be an electron.

The mobility of the charge carrier may be about 0.2 cm$^2$/V·s to about 7 cm$^2$/V·s.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. As used herein, the term "tin oxide semiconductor" refers to a semiconductor including a tin oxide, and may include tin oxide doped with antimony.

As used herein, the term "tin oxide semiconductor doped with antimony" refers to a tin oxide semiconductor which includes a predetermined ratio of antimony. Here, the amount of antimony contained in the tin oxide semiconductor is not necessarily less than that of the tin.

As used herein, the terms "SnO" and "SnO$_x$ (0<x≤3)" refer to a tin oxide semiconductor where the ratio of Sn:O can vary.

In an aspect of the present disclosure, there is provided a composition for a tin oxide semiconductor thin film as described herein below.

The composition for a tin oxide semiconductor thin film includes a tin precursor compound, an antimony precursor compound, and a solvent.

The tin precursor compound, though not limited thereto, may be selected from tin salts and their hydrates. For example, a tin precursor compound may be selected from the group consisting of tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, and a combination thereof.

The antimony precursor compound, though not limited thereto, may be selected from antimony salts and their hydrates. For example, the antimony precursor compound may be selected from the group consisting of antimony(III) chloride, antimony(V) chloride, antimony(III) ethoxide, antimony(V) sulfide, antimony(V) fluoride, antimony(III) propoxide, antimony(III) iodide, antimony(III) acetate, and a combination thereof.

The solvent may be selected from the group consisting of deionized water, methanol, ethanol, propanol, isopropanol, 2-methoxyethanol, 2-ethoxyethanol, 2-propoxyethanol 2-butoxyethanol, methyl cellosolve, ethyl cellosolve, diethyleneglycolmethylether, ethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyl lactate, propyleneglycolmethyletheracetate, propyleneglycolmethylether, propyleneglycolpropylether, methyl cellosolve acetate, ethyl cellosolve acetate, diethyleneglycolmethylacetate, diethyleneglycolethylacetate, acetone, methylisobutylketone, cyclohexanone, dimethylformamide(DMF), N,N-dimethylacetamide(DMAc), N-methyl-2-pyrrolidone, γ-butyrolactone, diethylether, ethyleneglycoldimethylether, diglyme, tetrahydrofuran, acetylacetone, acetonitrile, and a combination thereof.

In the composition for the tin oxide semiconductor thin film, the molar ratio between the antimony precursor compound and the tin precursor compound, i.e., Sb/Sn, may be about 0.4 to about 0.9, including values of 0.5, 0.6, 0.7 and 0.8. In the composition for the tin oxide semiconductor thin film, the respective concentration of the tin precursor compound and the antimony precursor compound is in a range of about 0.1M to about 10M, including values of 0.5M, 1.0M, 2.0M, 3.0M, 4.0M, 5.0M, 6.0M, 7.0M, 8.0M and 9.0M. When the tin precursor compound and the antimony precursor compound are maintained within the above ranges of molar ratio and concentration, the tin oxide semiconductor thin film manufactured therefrom may have good electric characteristics.

In an exemplary embodiment, the composition may include at least one additive to improve the characteristics of the thin film manufactured therefrom. In an embodiment, for example, a dispersing agent, a binding agent, a compatibilizing agent, a stabilizing agent, a pH adjuster, a viscosity controlling agent, an antiforming agent, a detergent, and/or a curing agent may be added to the composition.

The composition for the tin oxide semiconductor thin film may be used as a material in an electronic device, including a channel layer of a thin film transistor, and also for display devices or solar cells including the electric device.

In another aspect of the present disclosure, there is provided a method of forming a tin oxide semiconductor thin film that is described herein below.

Figure 1:
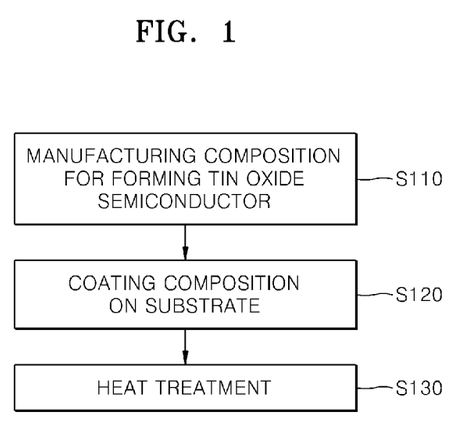
FIG. 1 is a flowchart illustrating a method of forming a tin oxide semiconductor thin film, according to an exemplary embodiment of the present invention.

FIG. 1 is a flowchart illustrating a method of forming a tin oxide semiconductor thin film according to an exemplary embodiment of the present invention. Referring to FIG. 1, there is provided a method of forming a tin oxide semiconductor thin film that includes preparing a composition for forming a tin oxide semiconductor thin film (S110); applying the composition to a substrate (S120); and performing a heat treatment on the substrate coated with the composition (S130). In step S120, in an embodiment, the composition may be disposed upon the substrate and in direct contact with it.

The tin oxide for forming the tin oxide semiconductor thin film may be produced by dissolving the tin precursor compound and the antimony precursor compound in a solvent (S110).

As mentioned above, the tin precursor compound, though not limited thereto, may be selected from tin salts and their hydrates. The tin precursor compound to be used may be selected from the group consisting of tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, and a combination thereof.

As mentioned above, the antimony precursor compound, though not limited thereto, may be selected from antimony salts and their hydrates. The antimony precursor compound to be used may be selected from the group consisting of antimony(III) chloride, antimony(V) chloride, antimony(III) ethoxide, antimony(V) sulfide, antimony(V) fluoride, antimony(III) propoxide, antimony(III) iodide, antimony(III) acetate, and a combination thereof.

The solvent to dissolve the tin precursor compound and the antimony precursor compound may be selected from the group consisting of, for example, deionized water, methanol, ethanol, propanol, isopropanol, 2-methoxyethanol, 2-ethoxyethanol, 2-propoxyethanol 2-butoxyethanol, methyl cellosolve, ethyl cellosolve, diethyleneglycolmethylether, ethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyl lactate, propyleneglycolmethyletheracetate, propyleneglycolmethylether, propyleneglycolpropylether, methyl cellosolve acetate, ethyl cellosolve acetate, diethyleneglycolmethylacetate, diethyleneglycolethylacetate, acetone, methylisobutylketone, cyclohexanone, dimethylformamide(DMF), N,N-dimethylacetamide(DMAc), N-methyl-2-pyrrolidone, γ-butyrolactone, diethylether, ethyleneglycoldimethylether, diglyme, tetrahydrofuran, acetylacetone, acetonitrile, and a combination thereof.

The tin precursor compound and the antimony precursor compound may be dissolved in the solvent at a temperature of about 60° C. about 80° C.

In the composition for forming the tin oxide semiconductor thin film, the molar ratio between the antimony precursor compound and the tin precursor compound, i.e., Sb/Sn, may be in the range of about 0.4 to about 0.9, including values of 0.5, 0.6, 0.7, and 0.8. When the molar ratio of the antimony precursor compound increases within the range, the charge carrier concentration decreases, resistivity increases, and charge carrier mobility increases in the formed tin oxide semiconductor. The major charge carriers in the tin oxide semiconductor are electrons.

In the composition for the tin oxide semiconductor thin film, the respective concentration of the tin precursor compound and the antimony precursor compound is in a range of about 0.1M to about 10M, including values of 0.5M, 1.0M, 2.0M, 3.0M, 4.0M, 5.0M, 6.0M, 7.0M, 8.0M and 9.0M. When the tin precursor compound and the antimony precursor compound are maintained within the above range of molar ratio and concentration, the tin oxide semiconductor thin film manufactured therefrom may have good electric characteristics.

Electric characteristics, such as resistivity and electron mobility, can be easily regulated by controlling the molar ratio between the antimony precursor compound and the tin precursor compound, i.e., (Sb/Sn), in the composition. Furthermore, since a tin oxide semiconductor thin film doped with antimony is formed from the composition solution where the metal precursor compounds are dissolved, the composition ratio between tin and antimony can be easily controlled and maintained at a uniform level in the thin film.

In addition, in order to improve the characteristics of the tin oxide semiconductor thin film, at least one additive selected from the group consisting of a dispersing agent, a binding agent, a compatibilizing agent, a stabilizing agent, a pH adjuster, a viscosity controlling agent, an antiforming agent, a detergent, and a curing agent may be added to the composition.

Then, the composition manufactured in step S110 is disposed upon a substrate (S120). The material to be used as the substrate may vary depending on the use of the tin oxide semiconductor thin film. For example, when the tin oxide semiconductor thin film forms an active layer of a thin film transistor, the substrate may be made of glass or plastic. The substrate may include other components of a thin film transistor, such as a gate electrode and a gate insulation layer. The applying of the composition, though not limited thereto, may be performed by spin coating, dip coating, inkjet printing, screen printing, a spray process, or a roll-to-roll process.

Exemplary glass substrates are quartz, silica, alumina, zirconia, titania, ceria, and a combination thereof. Exemplary plastic substrates are polyacetals, polyolefins, polyacrylics, polycarbonates, polystyrenes, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polyethylene terephthalate, polybutylene terephthalate, polyurethane, polytetrafluoroethylene, fluorinated ethylene propylene, perfluoroalkoxyethylene, polychlorotrifluoroethylene, polyvinylidene fluoride, or the like, or a combination comprising at least one of the foregoing organic polymers. In an exemplary embodiment, the substrates may be optically transparent.

Subsequently, the substrate with the composition disposed thereon is subjected to a heat treatment (S130). By the heat treatment, the solvent in the composition can be evaporated, and an oxide semiconductor can be formed from the tin precursor compound and the antimony precursor compound. The heat treatment may include a first heat treatment (a first bake) and a second heat treatment (a second bake). The first heat treatment may be performed at a temperature lower than that of the second heat treatment. The first heat treatment may be performed at a temperature of about 100° C. to about 300° C. for about 1 minute to about 10 minutes. The second heat treatment may be performed at a temperature of about 300° C. to about 500° C. for about 1 hour to about 2 hours. For example, the heat treatment, though not limited thereto, may be performed by using a hot-plate, a furnace, or a laser. Radiation such as microwaves, infrared radiation and the like may also be used for heating of the substrate if desired.

The thus formed tin oxide semiconductor thin film is amorphous. The resistivity of the tin oxide semiconductor thin film may be about $10^{-2}$ Ω·cm (ohm-cm) about $10^1$ Ω·cm. The charge carrier concentration of the tin oxide semiconductor thin film may be about $10^{14}$ cm$^{-3}$ (cubic centimeters) to about $10^{16}$ cm$^{-3}$. The charge carrier mobility of the tin oxide semiconductor thin film may be in the range of about 0.2 cm$^2$/V·s to about 7 cm$^2$/V·s (square centimeter per volt-second). The major charge carriers of the tin oxide semiconductor are electrons. Since the non-crystalline thin film has good electric characteristics, the tin oxide semiconductor thin film may be applied to a large area device and thus provide uniform characteristics.

The tin oxide semiconductor thin film may be used as a material for electronic devices, including a channel layer of a thin film transistor, and also a display device or a solar cell, which includes the electronic devices.

EXAMPLES

Experimental Example 1

This example was conducted to demonstrate the preparation of a tin oxide semiconductor precursor solution with a molar ratio of 0:1 between Sb (antimony) and Sn (tin).

0.5688 g of tin(II) chloride was added relative to 10 ml of 2-methoxyethanol, stirred for about 20 minutes using a stirring bar to obtain a solution. The molarity of tin(II) chloride in the solution was 0.3M. The thus obtained solution was removed of impurities by filtration using a 0.2 μm filter and a tin oxide semiconductor precursor solution was finally obtained.

Experimental Example 2

This example was conducted to demonstrate the preparation of a tin oxide semiconductor precursor solution with a molar ratio of 0.01:0.99 between Sb and Sn.

A tin oxide semiconductor precursor solution was obtained in the same manner as in Experimental Example 1 except that 0.00684 g of SbCl$_3$ (antimony chloride) and 0.56317 g of SnCl$_2$ (tin(II) chloride) i were used relative to 10 ml of 2-methoxyethanol to make the molar ratio between Sb and Sn be 0.01:0.99.

Experimental Example 3

This example was conducted to demonstrate the preparation of a tin oxide semiconductor precursor solution with a molar ratio of 0.02:0.98 between Sb and Sn.

A tin oxide semiconductor precursor solution was obtained in the same manner as in Experimental Example 1 except that 0.01369 g of SbCl$_3$ and 0.55748 g of SnCl$_2$ were used relative to 10 ml of 2-methoxyethanol to make the molar ratio between Sb and Sn be 0.02:0.98.

Experimental Example 4

This example was conducted to demonstrate the preparation of a tin oxide semiconductor precursor solution with a molar ratio of 0.04:0.96 between Sb and Sn.

A tin oxide semiconductor precursor solution was obtained in the same manner as in Experimental Example 1 except that 0.02737 g of SbCl$_3$ and 0.54611 g of SnCl$_2$ were used relative to 10 ml of 2-methoxyethanol to make the molar ratio between Sb and Sn be 0.04:0.96.

Experimental Example 5

This example was conducted to demonstrate the preparation of a tin oxide semiconductor precursor solution with a molar ratio of 0.06:0.94 between Sb and Sn.

A tin oxide semiconductor precursor solution was obtained in the same manner as in Experimental Example 1 except that 0.04106 g of SbCl$_3$ and 0.53473 g of SnCl$_2$ were used relative to 10 ml of 2-methoxyethanol to make the molar ratio between Sb and Sn be 0.06:0.94.

Experimental Example 6

This example was conducted to demonstrate the preparation of a tin oxide semiconductor precursor solution with a molar ratio of 0.08:0.92 between Sb and Sn.

A tin oxide semiconductor precursor solution was obtained in the same manner as in Experimental Example 1 except that 0.05475 g of SbCl$_3$ and 0.52335 g of SnCl$_2$ were used relative to 10 ml of 2-methoxyethanol to make the molar ratio between Sb and Sn be 0.08:0.92.

Experimental Example 7

This example was conducted to demonstrate the preparation of a tin oxide semiconductor precursor solution with a molar ratio of 0.1:0.9 between Sb and Sn.

A tin oxide semiconductor precursor solution was obtained in the same manner as in Experimental Example 1 except that 0.06844 g of SbCl$_3$ and 0.51197 g of SnCl$_2$ were used relative to 10 ml of 2-methoxyethanol to make the molar ratio between Sb and Sn be 0.1:0.9.

Experimental Example 8

This example was conducted to demonstrate the preparation of a tin oxide semiconductor precursor solution with a molar ratio of 0.15:0.85 between Sb and Sn.

A tin oxide semiconductor precursor solution was obtained in the same manner as in Experimental Example 1 except that 0.10265 g of SbCl$_3$ and 0.48353 g of SnCl$_2$ were used relative to 10 ml of 2-methoxyethanol to make the molar ratio between Sb and Sn be 0.15:0.85.

Experimental Example 9

This example was conducted to demonstrate the preparation of a tin oxide semiconductor precursor solution with a molar ratio of 0.2:0.8 between Sb and Sn.

A tin oxide semiconductor precursor solution was obtained in the same manner as in Experimental Example 1 except that 0.13687 g of SbCl$_3$ and 0.45509 g of SnCl$_2$ were used relative to 10 ml of 2-methoxyethanol to make the molar ratio between Sb and Sn be 0.2:0.8.

Experimental Example 10

This example was conducted to demonstrate the preparation of a tin oxide semiconductor precursor solution with a molar ratio of 0.3:0.7 between Sb and Sn.

A tin oxide semiconductor precursor solution was obtained in the same manner as in Experimental Example 1 except that 0.20531 g of SbCl$_3$ and 0.39820 g of SnCl$_2$ were used relative to 10 ml of 2-methoxyethanol to make the molar ratio between Sb and Sn be 0.3:0.7.

Experimental Example 11

This example was conducted to demonstrate the preparation of a tin oxide semiconductor precursor solution with a molar ratio of 0.4:0.6 between Sb and Sn.

A tin oxide semiconductor precursor solution was obtained in the same manner as in Experimental Example 1 except that 0.27374 g of SbCl$_3$ and 0.34132 g of SnCl$_2$ were used relative to 10 ml of 2-methoxyethanol to make the molar ratio between Sb and Sn be 0.4:0.6.

Experimental Example 12

This example was conducted to demonstrate the preparation of a tin oxide semiconductor precursor solution with a molar ratio of 0.5:0.5 between Sb and Sn.

A tin oxide semiconductor precursor solution was obtained in the same manner as in Experimental Example 1 except that 0.34219 g of SbCl$_3$ and 0.28443 g of SnCl$_2$ were used relative to 10 ml of 2-methoxyethanol to make the molar ratio between Sb and Sn be 0.5:0.5.

Experimental Example 13

This example was conducted to demonstrate the preparation of a tin oxide semiconductor precursor solution with a molar ratio of 0.9:0.1 between Sb and Sn.

A tin oxide semiconductor precursor solution was obtained in the same manner as in Experimental Example 1 except that 0.41062 g of SbCl$_3$ and 0.22754 g of SnCl$_2$ were used relative to 10 ml of 2-methoxyethanol to make the molar ratio between Sb and Sn be 0.9:0.1.

Experimental Example 14

This example was conducted to demonstrate the preparation of a tin oxide semiconductor precursor solution with a molar ratio of 1:0 between Sb and Sn.

A tin oxide semiconductor precursor solution was obtained in the same manner as in Experimental Example 1 except that 0.68436 g of SbCl$_3$ was used relative to 10 ml of 2-methoxyethanol to make the molar ratio between Sb and Sn be 1:0.

Experimental Example 15

This example was conducted to demonstrate the preparation of a tin oxide semiconductor thin film with a molar ratio of 0:1 between Sb and Sn and disposing it on a substrate.

A tin oxide semiconductor thin film was formed on a glass substrate using the tin oxide semiconductor solution prepared in Experimental Example 1 by using a spincoater. The spin coating was performed for 30 seconds at 3,000 rpm. The spin-coated thin film was subjected to a first heat treatment in a hot plate kept at 300° C. for 5 minutes and then to a second heat treatment at 500° C. for 2 hours to thereby form a tin oxide semiconductor thin film with a thickness of 30 nm on the glass substrate.

Experimental Example 16

This example was conducted to demonstrate the preparation of a tin oxide semiconductor thin film with a molar ratio of 0.01:0.99 between Sb and Sn.

A tin oxide semiconductor thin film was formed on the glass substrate in the same manner as in Experimental Example 15 except that the tin oxide semiconductor precursor solution in Experimental Example 2 was used instead of that of Experimental Example 1.

Experimental Example 17

This example was conducted to demonstrate the preparation of a tin oxide semiconductor thin film with a molar ratio of 0.02:0.98 between Sb and Sn.

A tin oxide semiconductor thin film was formed on the glass substrate in the same manner as in Experimental Example 15 except that the tin oxide semiconductor precursor solution in Experimental Example 3 instead of that of Experimental Example 1.

Experimental Example 18

This example was conducted to demonstrate the preparation of a tin oxide semiconductor thin film with a molar ratio of 0.04:0.96 between Sb and Sn.

A tin oxide semiconductor thin film was formed on the glass substrate in the same manner as in Experimental Example 15 except that the tin oxide semiconductor precursor solution in Experimental Example 4 was used instead of that of Experimental Example 1.

Experimental Example 19

This example was conducted to demonstrate the preparation of a tin oxide semiconductor thin film with a molar ratio of 0.06:0.94 between Sb and Sn.

A tin oxide semiconductor thin film was formed on the glass substrate in the same manner as in Experimental Example 15 except that the tin oxide semiconductor solution in Experimental Example 5 was used instead of that of Experimental Example 1.

Experimental Example 20

This example was conducted to demonstrate the preparation of a tin oxide semiconductor thin film with a molar ratio of 0.08:0.92 between Sb and Sn.

A tin oxide semiconductor thin film was formed on the glass substrate in the same manner as in Experimental Example 15 except that the tin oxide semiconductor solution in Experimental Example 6 was used instead of that of Experimental Example 1.

Experimental Example 21

This example was conducted to demonstrate the preparation of a tin oxide semiconductor thin film with a molar ratio of 0.1:0.9 between Sb and Sn.

A tin oxide semiconductor thin film was formed on the glass substrate in the same manner as in Experimental Example 15 except that the tin oxide semiconductor solution in Experimental Example 7 was used instead of that of Experimental Example 1.

Experimental Example 22

This example was conducted to demonstrate the preparation of a tin oxide semiconductor thin film with a molar ratio of 0.15:0.85 between Sb and Sn.

A tin oxide semiconductor thin film was formed on the glass substrate in the same manner as in Experimental Example 15 except that the tin oxide semiconductor solution in Experimental Example 8 was used instead of that of Experimental Example 1.

Experimental Example 23

This example was conducted to demonstrate the preparation of a tin oxide semiconductor thin film with a molar ratio of 0.2:0.8 between Sb and Sn.

A tin oxide semiconductor thin film was formed on the glass substrate in the same manner as in Experimental Example 15 except that the tin oxide semiconductor solution in Experimental Example 9 was used instead of that of Experimental Example 1.

Experimental Example 24

This example was conducted to demonstrate the preparation of a tin oxide semiconductor thin film with a molar ratio of 0.3:0.7 between Sb and Sn.

A tin oxide semiconductor thin film was formed on the glass substrate in the same manner as in Experimental Example 15 except that the tin oxide semiconductor solution in Experimental Example 10 was used instead of that of Experimental Example 1.

Experimental Example 25

This example was conducted to demonstrate the preparation of a tin oxide semiconductor thin film with a molar ratio of 0.4:0.6 between Sb and Sn.

A tin oxide semiconductor thin film was formed on the glass substrate in the same manner as in Experimental Example 15 except that the tin oxide semiconductor solution in Experimental Example 11 was used instead of that of Experimental Example 1.

Experimental Example 26

This example was conducted to demonstrate the preparation of a tin oxide semiconductor thin film with a molar ratio of 0.5:0.5 between Sb and Sn.

A tin oxide semiconductor thin film was formed on the glass substrate in the same manner as in Experimental Example 15 except that the tin oxide semiconductor solution in Experimental Example 12 was used instead of that of Experimental Example 1.

Experimental Example 27

This example was conducted to demonstrate the preparation of a tin oxide semiconductor thin film with a molar ratio of 0.9:0.1 between Sb and Sn.

A tin oxide semiconductor thin film was formed on the glass substrate in the same manner as in Experimental Example 15 except that the tin oxide semiconductor solution in Experimental Example 13 was used instead of that of Experimental Example 1.

Experimental Example 28

This example was conducted to demonstrate the preparation of a tin oxide semiconductor thin film with a molar ratio of 1:0 between Sb and Sn.

A tin oxide semiconductor thin film was formed on the glass substrate in the same manner as in Experimental Example 15 except that the tin oxide semiconductor solution in Experimental Example 14 was used instead of that of Experimental Example 1.

Evaluation of Characteristics of a Tin Oxide Semiconductor Thin Film

Figure 2:
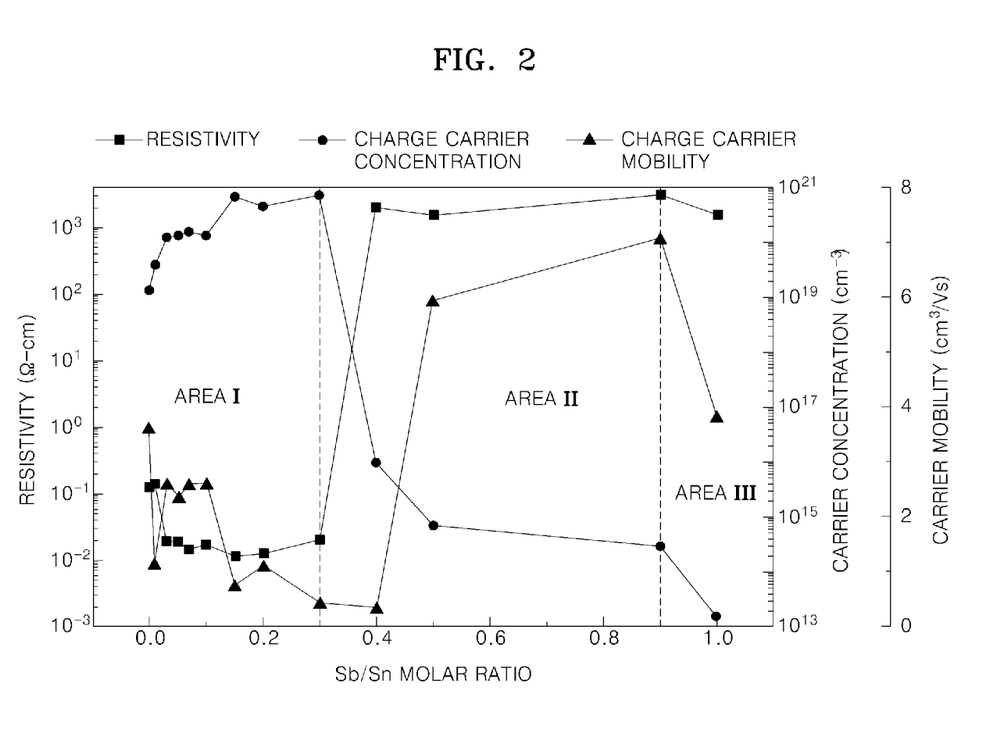
FIG. 2 is a graph showing the results of resistivity, charge carrier concentration, and charge carrier mobility of tin oxide semiconductor thin films, measured according to a molar ratio between antimony(Sb) and tin(Sn)

FIG. 2 is a graph showing the results of resistivity, charge carrier concentration, and charge carrier mobility of tin oxide semiconductor thin films, which were formed in Experimental Examples 15-28, measured versus a molar ratio between antimony(Sb) and tin(Sn).

The resistivity was measured by using HMS-3000 (Ecopia). The concentration and mobility of charge carriers were measured via the "Hall effect measurement" by using HMS-3000 (Ecopia). As used herein, the term "charge carrier" refers to major charge carriers contributing to current, and the charge carriers in the tin oxide semiconductor of Experimental Examples of the present invention are electrons or holes.

In the graph shown in FIG. 2, as the concentration of Sb/Sn increases, the concentration of charge carriers also increases and then decreases. It is speculated that the concentration of charge carriers increases by the additional electron supply by antimony doping in the tin lattice, up to the point where the antimony doping becomes excessive. At the point of excess antimony doping, the antimony doping effect disappears and the antimony becomes present in the state of an alloy with tin, thereby forming an antimony oxide ($SbO_x$) with low conductivity.

Further, in the graph shown in FIG. 2, the tin oxide semiconductor shows a conductor characteristic with low resistivity in area I (Sb/Sn<0.3) where the molar ratio of Sb/Sn is low, whereas the tin oxide semiconductor displays semiconducting characteristics with higher resistivity in areas II and III (Sb/Sn>0.3) where the molar ratio of Sb/Sn is increased. In addition, in the graph shown in FIG. 2, the mobility of charge carriers is especially high in an area where the molar ratio of Sb/Sn is in a range of 0.4<Sb/Sn<0.9, thus confirming that the tin oxide semiconductor can be used as a semiconductor material in the range.

Figure 3:
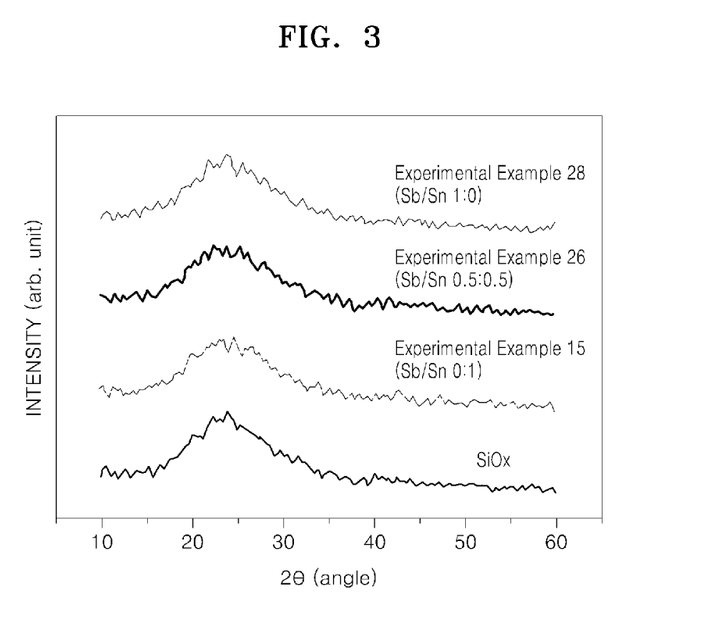
FIG. 3 is a graph showing the x-ray diffraction (XRD) of a tin oxide semiconductor thin film according to an antimony doping.

FIG. 3 is a graph showing the x-ray diffraction (XRD) of a tin oxide semiconductor thin film according to an antimony doping. XRD was measured by using a DMAX-2500 (Rikaku) for tin oxide semiconductor thin films and silicon oxide thin films (SiOx) on glass substrates with a thickness of about 30 nm as prepared in Experimental Example 15 (Sb/Sb 0:1), Experimental Example 26 (Sb/Sb 0.5:0.5), and Experimental Example 28 (Sb/Sb 1:0).

Referring to the graph shown in FIG. 3, the tin oxide semiconductor thin (SiOx) film not doped with antimony is non-crystalline as the silicon oxide thin film. Furthermore, it is observed that the tin oxide semiconductor thin film doped with antimony remains non-crystalline even when the amount of the antimony dopant increases. In addition, it is worth noting that the tin oxide semiconductor thin film can maintain uniform electric characteristics when it is applied to a large area because a non-crystalline thin film can avoid electric characteristics changes due to grains, the shape, number and direction of grain boundaries in the case of a polycrystalline thin film.

It should be understood that the exemplary embodiments described therein should be considered in a descriptive sense only and not for purposes of limitation. Descriptions of features or aspects within each embodiment should typically be considered as available for other similar features or aspects in other embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a tin oxide semiconductor thin film, the method comprising:
    preparing a composition comprising a tin precursor compound and an antimony precursor compound dissolved in a solvent;
    disposing the composition on a substrate; and
    performing a heat treatment on the substrate applied with the composition,
    wherein the molar ratio between the antimony precursor compound and the tin precursor compound is in a range of about 0.4 to about 09.

2. The method according to claim 1, wherein the tin precursor compound includes tin(II) chloride, tin(II) iodide, tin (II) chloride dihydrate, tin(II) bromide, tin(IV) fluoride, tin (II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combination thereof.

3. The method according to claim 1, wherein the antimony precursor compound includes antimony(III) chloride, antimony(V) chloride, antimony(III) ethoxide, antimony(V) sulfide, antimony(V) fluoride, antimony(III) propoxide, antimony(III) iodide, antimony(III) acetate, or a combination thereof.

4. The method according to claim 1, wherein the solvent includes deionized water, methanol, ethanol, propanol, isopropanol, 2-methoxyethanol, 2-ethoxyethanol, 2-propoxyethanol 2-butoxyethanol, methyl cellosolve, ethyl cello solve, diethyleneglycolmethylether, ethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyl lactate, propyleneglycolmethyletheracetate, propyleneglycolmethylether, propyleneglycolpropylether, methyl cellosolve acetate, ethyl cellosolve acetate, diethyleneglycolmethylacetate, diethyleneglycolethylacetate, acetone, methylisobutylketone, cyclohexanone, dimethylformamide (DMF), N,N-dimethylacetamide(DMAc), N-methyl-2-pyrrolidone, γ-butyrolactone, diethylether, ethyleneglycoldimethylether, diglyme, tetrahydrofuran, acetylacetone, acetonitrile, or a combination thereof.

5. The method according to claim 1, wherein a respective concentration of the antimony precursor compound and the tin precursor compound relative to a total composition is in a range of about 0.1M to about 10M.

6. The method according to claim 1, wherein the heat treatment comprises a first heat treatment performed at a temperature of about 100° C. to about 300° C., and a second heat treatment performed at a temperature of about 300° C. to about 500° C.

7. The method according to claim 1, wherein the applying is performed using a method which includes spin coating, dip coating, inkjet printing, screen printing, a spray process, and roll-to-roll process.

8. The method according to claim 1, wherein the tin oxide semiconductor includes SnOx ($0<x\leq3$) wherein Sb is doped thereon.

9. The method according to claim 1, wherein the tin oxide semiconductor thin film is amorphous.

10. The method according to claim 1, wherein a resistivity of the tin oxide semiconductor thin film is in a range of about 10-2 Ω·cm to about 101 Ω·cm.

11. The method according to claim 1, wherein a concentration of a charge carrier of the tin oxide semiconductor thin film is in a range of about 1014 cm-3 to about 1016 cm-3.

12. The method according to claim 11, wherein the charge carrier is an electron.

13. The method according to claim 1, wherein a mobility of the charge carrier is in a range of about 0.2 cm2/V·s to about 7 cm2/V·s.

14. A method of forming a tin oxide semiconductor thin film, the method comprising:
    preparing a composition comprising a tin precursor compound and an antimony precursor compound dissolved in a solvent;
    disposing the composition on a substrate; and
    performing a heat treatment on the substrate applied with the composition,
    wherein the heat treatment comprises a first heat treatment and a second heat treatment performed at a temperature higher than a temperature of the first heat treatment.

15. The method according to claim 14, wherein the heat treatment comprises a first heat treatment performed at a temperature of about 100° C. to about 300° C., and a second heat treatment performed at a temperature of about 300° C. to about 500° C.

16. The method according to claim 14, wherein the applying is performed using a method which includes spin coating, dip coating, inkjet printing, screen printing, a spray process, and roll-to-roll process.

17. The method according to claim 14, wherein the tin oxide semiconductor includes SnOx ($0<x\leq3$) wherein Sb is doped thereon.

18. The method according to claim 14, wherein at least one of a resistivity of the tin oxide semiconductor thin film is in a range of about $10^{-2}$ Ω·cm to about $10^1$ Ω·cm, a concentration of a charge carrier of the tin oxide semiconductor thin film is in a range of about $10^{14}$ cm$^{-3}$ to about $10^{16}$ cm$^{-3}$, and a mobility of the charge carrier is in a range of about 0.2 cm$^2$/V·s to about 7 cm$^2$/V·s.

19. The method according to claim 18, wherein the charge carrier is an electron.

20. A method of forming a tin oxide semiconductor thin film, the method comprising:
   preparing a composition comprising a tin precursor compound and an antimony precursor compound dissolved in a solvent;
   disposing the composition on a substrate; and
   performing a heat treatment on the substrate applied with the composition,
   wherein the tin oxide semiconductor thin film is amorphous.

* * * * *